Jan. 16, 1968 R. DAHLBERG 3,364,085

METHOD FOR MAKING SEMICONDUCTOR DEVICE

Filed May 18, 1964 2 Sheets-Sheet 1

Inventor:
Reinhard Dahlberg
By: Spencer & Kaye
ATTORNEYS

METHOD FOR MAKING SEMICONDUCTOR DEVICE

Filed May 18, 1964

Inventor:
Reinhard Dahlberg
By: Spencer & Kaye
ATTORNEYS

United States Patent Office 3,364,085

Patented Jan. 16, 1968

3,364,085

METHOD FOR MAKING SEMICONDUCTOR DEVICE

Reinhard Dahlberg, Heilbronn (Neckar), Germany, assignor to Telefunken Patentverwertungs-G.m.b.H., Ulm (Danube), Germany Filed May 18, 1964, Ser. No. 368,058
Claims priority, application Germany, May 18, 1963, T 24,016
9 Claims. (Cl. 148—187)

ABSTRACT OF THE DISCLOSURE

A method for diffusing impurities into a semiconductor body while preventing evaporation of both the impurity and the material of the semiconductor body, which method involves applying diffusion material to a part of the semiconductor body surface, covering the diffusion material with a substance which prevents evaporation of the diffusion material at the diffusion temperature, at which the material would otherwise evaporate, and diffusing impurities from the diffusion material into the semiconductor body.

The present invention relates to a method for diffusing impurities into a semiconductor body, in which method the diffusion material is applied to the surface of the semiconductor body.

It is known that vacuum diffusion, in which the diffusion process takes place in a high vacuum, has the advantage over customary diffusion methods that the degree of purity obtainable is substantially higher than when the diffusion takes place in a flowing gas. However, the temperature range at which vacuum diffusion can be carried out is restricted, since, under certain circumstances, the applied diffusion material evaporates at the diffusion temperatures. A further disadvantageous phenomenon is the "thermal etching" of the semiconductor surface, the surface evaporating at high temperatures and incurring fissures. This happens, for example, in the case of silicon at a temperature above 1,000° C. and in the case of germanium at temperatures between 800 and 850° C.

It is an object of the present invention to provide a diffusion process which can be carried out in high vacuum at any desired temperatures. In a process for diffusing impurities into a semiconductor upon whose surface diffusion material has been applied, the invention comprises covering the diffusion material, before diffusion, with a substance which prevents an evaporation of the diffusion material at the diffusion temperatures.

Such a covering or coating is generally also at least partially applied to those portions of the semiconductor surface not covered with diffusion material, if it is desired to prevent evaporation at the diffusion temperature of those portions. The covering may be a quartz layer, for example, which can be applied by vaporizing, or thermally breaking up a silicon compound. Alternatively, it may be an oxide layer.

The impurity material is not usually applied to the semiconductor body in pure form, but dispersed in homogeneous or heterogeneous semiconductor material in the form of a semiconductor layer doped with the diffusion impurities.

It is furthermore an object of the present invention not only to prevent evaporation of the diffusion substance and/or the semiconductor surface, but also to do away with the necessity of creating diffusion windows in covering masks. According to the method of the invention, the aforementioned diffusion window process is replaced by a process which involves locally vaporizing the diffusion substance onto the surface, and subsequently covering the surface with an oxide layer, for example by thermal or chemical oxidation. Thus, the advantages of the method of the invention are not limited to high vacuum diffusions.

Additional objects and advantages of the present invention will become apparent upon consideration of the following description when taken in conjunction with the accompanying drawings in which.

Figure 1:
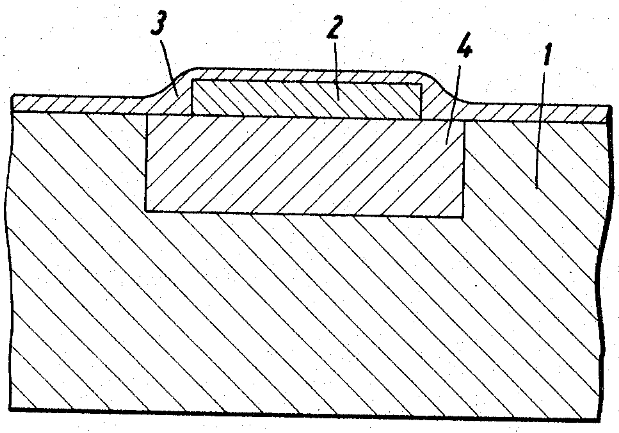
FIGURE 1 is a schematic sectional view through a semiconductor diode during the production thereof.

In the method of producing a diode shown in FIGURE 1, first a silicon body 2 doped with p impurities is vaporized upon the surface of the semiconductor body 1 made of silicon of the n conductivity type. In order, during high vacuum diffusion, to prevent the silicon as well as the acceptors in body 2 to be diffused into it from evaporating, the semiconductor body 1 as well as the diffusion substance 2 are covered with a quartz layer 3. In the vaporizing process as shown in FIGURE 1, this quartz layer covers only one side of the surface, while in the thermal oxidation process the oxide layer covers the entire surface of the semiconductor body.

A layer of quartz can be vaporized on the surface of the semiconductor body for example by beams of electrons. In the same way can be applied also magnesium oxide. The thermally breaking up of tetraethoxysilan or any other silan is a further way to separate a quartz layer on the semiconductor body. That takes place in the atmosphere of nitrogen at temperatures between 600 and 700° C. It is also known in the art for protective coating to oxidize the surface of a semiconductor body in a stream of oxygen at temperatures around 1100° C.

By diffusing the acceptors contained in the vaporized silicon into the semiconductor body 1, the diffusion zone 4 is created, which is of the p conductivity type. The finished diode is then obtained by attaching contacts to the p-conductive zone 4, as well as the n-conductive base body 1. Zone 4 may be contacted through a hole etched in the protective coating, for example by a photochemical process with known etching liquids which dissolve the protective coating but do not etch the semiconductor surface.

Figure 2:
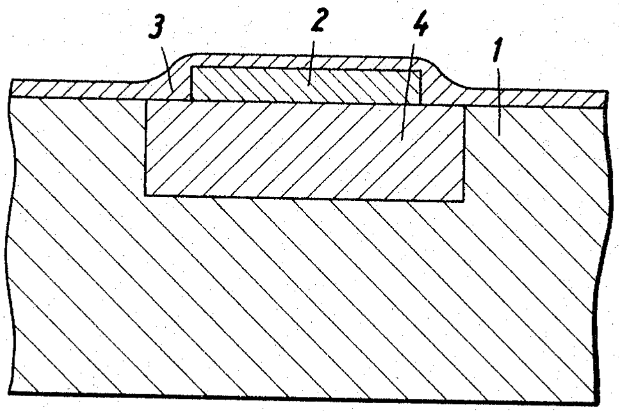
FIGURE 2 is a schematic sectional view through a semiconductor body during one stage in the preparation of a transistor.

A transistor can be produced in accordance with the inventive process in different ways, one of which is illustrated in FIGURE 2. First a layer 2 doped with impurities and consisting of the material of semiconductor body 1 is vaporized upon the semiconductor, as in the case of the diode of FIGURE 1. This vaporized layer serves as diffusion source for producing the base zone. In order to prevent evaporation of the diffusion substance and of the semiconductor material when the base zone is diffused, the layer 2 as well as the remaining part of the semiconductor surface are covered with a quartz layer 3, according to FIGURE 2. The base zone 4 is created by diffusion in high vacuum at a temperature of approximately 1,200° C. The method steps for producing the base zone of a transistor are the same as those used for producing the diode according to FIGURE 1; thus, FIGURE 2 is similar to FIGURE 1.

Subsequent to the base diffusion, the emitter zone is produced by a similar diffusion. For this purpose, first the quartz layer 3 of FIGURE 2 is removed.

The layer of quartz is to be dissolved in an aqueous solution of hydrofluoric acid to which is added ammonium fluoride without etching the semiconductor surface. In the same way a protective coating of magnesium oxide could be dissolved in hydrochloric acid.

Figure 3:
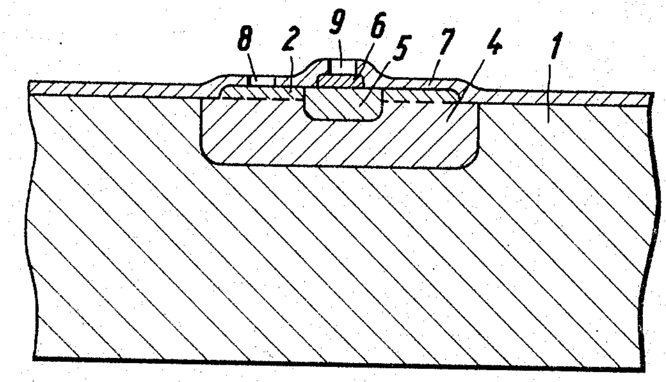
FIGURE 3 is a schematic sectional view through the body shown in FIGURE 2 during another stage in making the device.

After removal of layer 3, as illustrated in FIGURE 3, a semiconductor layer 6 is vaporized onto the doped semiconductor layer 2. The layer 6 contains impurities for the emitter. The diffusion of the emitter zone takes place, however, only after the semiconductor layer 6 has also been covered by a quartz layer in a second oxidation process. In this second oxidation process the quartz layer 7 is obtained, which covers the two vaporized layers 2 and 6 as well as that portion of the semiconductor surface which is free from diffusion substances. Thus neither doping nor semiconductor materials can evaporate when diffusing the emitter zone 5. The contacts for the transistor can be provided in the holes 8 and 9, etched out of the quartz layer 7 for the base zone 4 and the emitter zone 5. For the collector zone 1, the contacts are preferably provided on the opposite side of the semiconductor body 1.

Figure 4:
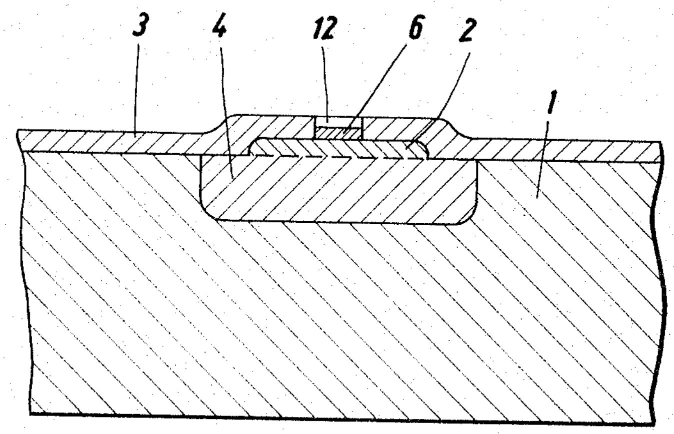
FIGURE 4 is a schematic sectional view through a semiconductor body during one stage in the preparation of a transistor which differs from FIGURES 2 and 3.

While, in the method described above, preferably the entire quartz masking is removed after the base diffusion, it is also possible to remove the quartz layer present on top of the base diffusion substance 2 only in the region of intended emitter diffusion as shown in FIGURE 4, this removal taking place after the base diffusion. A semiconductor material 6 doped with impurities can be inserted, for the emitter, into the diffusion window 12 which has been produced by the partial removal of the quartz mask. In addition, before the emitter diffusion, the surface of the emitter diffusion substance is again covered with a quartz layer 13 (as shown in FIGURE 5), similar to that of the preceding embodiment.

Figure 5:
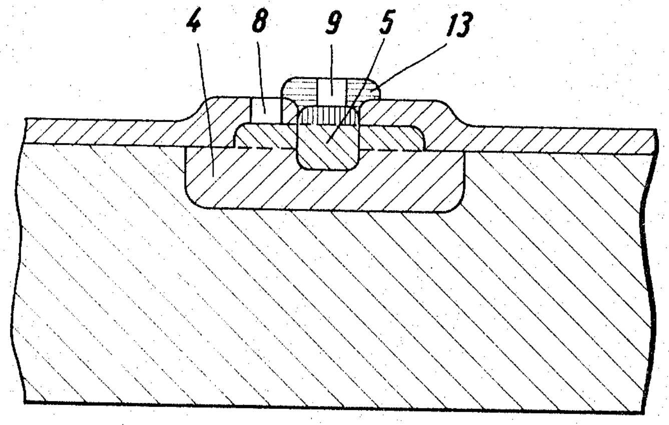
FIGURE 5 is a schematic sectional view through the body shown in FIGURE 4 during another stage in making the device.

According to FIGURE 5, the holes 8 and 9 etched out of the quartz layer serve for contacting the base zone 4 and the emitter zone 5, as in the embodiment of FIGURE 3. The actual contacting may be carried out, for example, by a metal deposit in the mentioned holes.

It will be understood that the above description of the present invention is susceptible to various modifications, changes, and adaptations, and the same are intended to be comprehended within the meaning and range of equivalents of the appended claims.

What is claimed is:

1. A method of making a diode, comprising the steps of:
   applying to one side of a semiconductor body of a first conductivity type a semiconductor layer doped with impurities of the opposite conductivity type;
   covering the exposed surfaces of the semiconductor body and semiconductor layer with a substance for preventing evaporation of semiconductor material and impurities at diffusion temperatures at which such material and impurities would otherwise evaporate;
   diffusing said impurities from the semiconductor layer into the semiconductor body to produce a zone of said opposite conductivity type; and
   applying ohmic contacts to said zone and to a different portion of the semiconductor body.

2. A method as defined in claim 1, wherein said substance is a layer of quartz, the semiconductor body is of silicon, and the diffusion temperature is above 800° C.

3. A method as defined in claim 1, wherein the step of covering is carried out by vaporizing a silicon compound onto the semiconductor body.

4. A method as defined in claim 1, wherein the semiconductor layer consists of material of the same conductivity as the semiconductor body.

5. A method as defined in claim 1, wherein the step of applying the semiconductor layer is carried out by vaporizing the doped semiconductor material onto the semiconductor body.

6. A method as defined in claim 1, wherein said step of diffusing is carried out under a high vacuum.

7. A method of making a transistor, comprising the steps of:
   applying, to one side of a semiconductor body of one conductivity type, a first semiconductor layer doped with impurities of the opposite conductivity type;
   covering the exposed surfaces of the semiconductor body and semiconductor layer with a substance for preventing evaporation of semiconductor material and said impurities, at diffusion temperatures;
   diffusing the impurities in said semiconductor layer into the semiconductor body to form a base zone of such opposite conductivity type;
   removing said evaporation-preventing substance;
   vaporizing a second semiconductor layer, doped with impurities of the first conductivity type, onto the first semiconductor layer;
   covering the exposed surfaces of the semiconductor layers and the semiconductor body with a substance for preventing evaporation of semiconductor material and impurities at diffusion temperatures;
   diffusing the impurities in said second semiconductor layer into said base zone to form an emitter zone of the first conductivity type;
   providing holes in the evaporation-preventing substance adjacent said first and second semiconductor layers; and
   applying ohmic contacts to said layers through the holes, and applying an ohmic contact to the semiconductor body.

8. In a method of diffusing impurities into a semiconductor body having a diffusion material applied to its surface, the improvement comprising the steps of covering over the diffusion material with a substance which prevents evaporation thereof at the diffusion temperature.

9. A method as defined in claim 8 comprising diffusing the diffusion material into the body, and then removing said substance.

References Cited

UNITED STATES PATENTS

| | | | |
|---|---|---|---|
| 3,025,438 | 3/1962 | Wegener | 148—187 X |
| 3,055,776 | 9/1962 | Stevenson | 148—187 X |
| 3,167,461 | 1/1965 | Compton | 148—175 |
| 3,184,823 | 5/1965 | Little | 148—187 X |
| 3,200,019 | 8/1965 | Scott | 148—187 X |
| 3,203,840 | 8/1965 | Harris | 148—187 |
| 3,243,323 | 3/1966 | Corrigan | 148—175 |
| 3,287,187 | 11/1966 | Rosenheinrich | 148—188 X |

HYLAND BIZOT, *Primary Examiner.*